United States Patent [19]

Kelly et al.

[11] Patent Number: 5,323,013
[45] Date of Patent: Jun. 21, 1994

[54] METHOD OF RAPID SAMPLE HANDLING FOR LASER PROCESSING

[75] Inventors: Eugene P. Kelly, Spring Valley; Stephen D. Russell; Douglas A. Sexton, both of San Diego, all of Calif.

[73] Assignee: The United States of America as represented by the Secretary of the Navy, Washington, D.C.

[21] Appl. No.: 861,409

[22] Filed: Mar. 31, 1992

[51] Int. Cl.$^5$ .............................................. B01J 19/12
[52] U.S. Cl. ................................ 250/522.1; 422/186.3
[58] Field of Search .................... 422/186.3; 250/364, 250/522.1

[56] References Cited

U.S. PATENT DOCUMENTS

| | | | |
|---|---|---|---|
| 3,811,182 | 5/1974 | Ryan, Sr. et al. | 29/574 |
| 4,888,101 | 12/1989 | Cooper | 204/157.15 |
| 4,961,052 | 10/1990 | Tada et al. | 324/158 P |
| 4,975,638 | 12/1990 | Evans et al. | 324/158 P |
| 5,027,063 | 6/1991 | Letourneau | 324/158 F |
| 5,229,081 | 7/1993 | Suda | 427/186 |
| 5,272,414 | 12/1993 | Iwanaga | 313/631 |

OTHER PUBLICATIONS

XMR Laser Planarization System (Descriptive Literature).
Deacon et al, *Automation and Defect Control-For CCD Devices*, Micro. Mfg. Tech., May, 1991, pp. 35-38.
Russell et al, *Bipolar Transistors-Effects of Nanosecond Thermal Processing*, IEEE SOS/SOI Tech. Conf. Proceedings, (1990).
Palmer et al., *Conf. on Lasers-Series 1988*, vol. 7 (Opt. Soc. of America, Wash., D.C. 1988) Image Micro Systems Laser Processing System (Descriptive Literature).
Hess et al, *App'ns of Laser Annealing in IC Fabrication*, Mat. Res. Soc. Symp. Proc., 13, 337 (1983).
Pressley, *Gas Immersion Laser Diffusion*, Proc. SPIE, 385, 30 (1983).
Lowndes et al, *Pulsed Excimer Laser-and Solar Cell Fabrication*, Mat. Res. Soc. Symp. Proc., 13, 407 (1983).
Weiner et al., *Thin-Based Bipolar-Laser Doping*. IEEE Electron Dev. Lett., vol. 210 (1989).
Russell et al, *Excimer Laser-Assisted Etching of Si Using Chloropentafluoroethane*, Res. Soc. Proc., 158, 325 (1990).
Lubben et al, *Laser-Induced Plasmas-Get Si Films*, J. Vac. Sci. Technol., B, 3, 968 (1985).
Abelson et al., *Epitaxial-Ge on Si (100) Substrates*, Appl. Phys. Lett., 52, 230 (1988).
Bell, *Review & Analysis of Laser Annealing*, RCA Review, 40, 295 (1979).

*Primary Examiner*—Peter A. Nelson
*Attorney, Agent, or Firm*—Harvey Fendelman; Thomas Glenn Keough

[57] ABSTRACT

A method of rapid sample handling in a production environment for laser processing of individual microelectronic die is particularly suited for handling partially fabricated die and die which are susceptible to mechanical and electrostatic damage, such as backside illuminated CCDs requiring backside dopant activation and laser texturing of sidewalls. Securing a die within a modified sample holder provides for electrostatic and mechanical protection during laser processing. Placing the modified die holder onto a feeder base portion that engages a "tractor-feed" translation subsystem protects the die during a translation and positioning of the die below and aligned with a laser processing structure. A window holder is engaged with the die holder to seal the die in a processing chamber and to assure an appropriate pressurizing with a gaseous ambient for a desired processing. Illuminating, repetitively if desired, the die in the chamber with a laser beam of appropriate size, laser fluence, repetition rate and number of pulses processes the die. Next, the processed die is translated from beneath laser processing structure while the next die is correctly positioned for processing.

21 Claims, 2 Drawing Sheets

FIG. 4

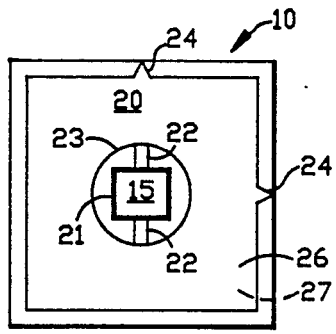
PRIOR ART
FIG. 1
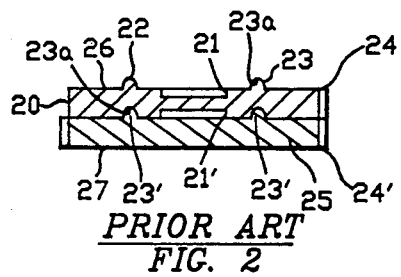
PRIOR ART
FIG. 2
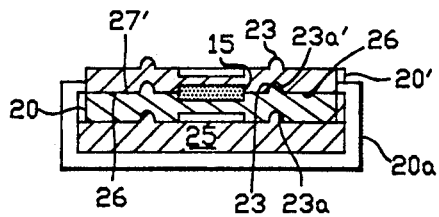
PRIOR ART
FIG. 3
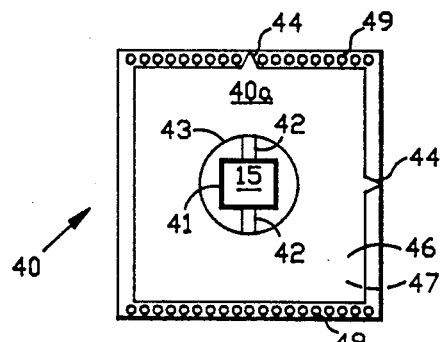
FIG. 4
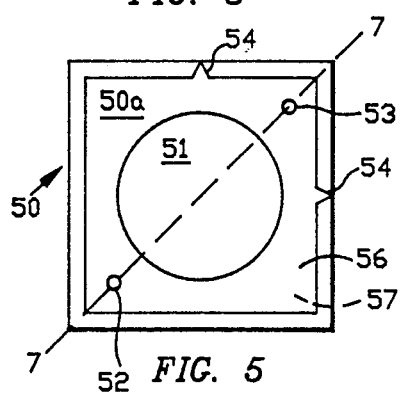
FIG. 5
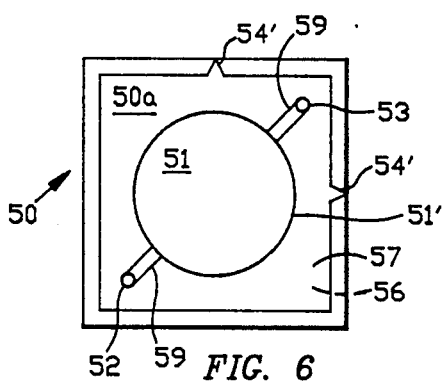
FIG. 6
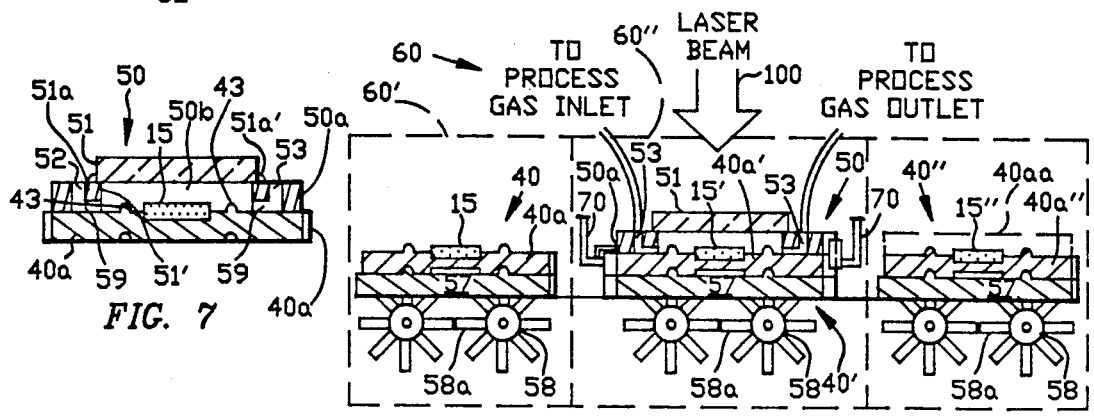
FIG. 7
FIG. 8

METHOD OF RAPID SAMPLE HANDLING FOR LASER PROCESSING

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED PATENT APPLICATIONS

This is a continuing application of the copending patent applications entitled "Excimer Laser-Assisted Etching of Silicon Using Halocarbon Ambients" by S. D. Russell et al., U.S. Ser. No. 07/501,707, "Excimer Laser-Assisted Etching of III-V and II-VI Semiconductor Compounds Using Chlorofluorocarbon Ambients" by S. D. Russell et al., U.S. Ser. No. 07/508,317, "Excimer Laser Dopant Activation of Backside Illuminated CCDs" by D. A. Sexton et al., U.S. Ser. No. 07/591,930, and "Laser Texturing" by S. D. Russell et al., U.S. Ser. No. 07/589,839 and hereby incorporates by reference all documents and references of these applications herein.

BACKGROUND OF THE INVENTION

Laser processing of materials has exhibited enormous growth since the commercial availability of the excimer laser in the late 1970s. Materials processing has been investigated in the realm of organic polymers, ceramics, metals and semiconductors. Semiconductor processing of silicon for VLSI applications range from laser-assisted etching, as disclosed in S. D. Russell et al's. "Excimer Laser-Assisted Etching of Silicon Using Chloropentafluoroethane," in R. Rosenberg et al., eds., *In-Situ Patterning: Selective Area Deposition and Etching*, Mater. Res. Soc. Proc., vol. 158 (1990), p. 325; chemical vapor deposition (CVD), in the article "Laser-Induced Plasmas for Primary Ion Deposition of Epitaxial Ge and Si Films by D. Lubben et al., *J. Vac. Sci. Technol.* B, Vol. 3 (1985), p. 968; and alloy formation, see J. R. Abelson et al., "Epitaxial $Ge_xSi_{1-x}$/Si (100) Structures Produced by Pulsed Laser Mixing of Evaporated Ge on Si (100) Substrates", *Appl. Phys. Lett.*, vol. 52 (1988), p. 230; to name a few. Laser activation of ion implanted dopant has long been known as an alternative to conventional furnace annealing, as discussed in A. E. Bell's "Review and Analysis of Laser Annealing," *RCA Review*, vol. 40 (1979), p. 295; and L. D. Hess et al.'s "Applications of Laser Annealing in IC Fabrication", in J. Narayan et al., eds., *Laser-Solid Interactions and Transient Thermal Processing of Materials*, Mat. Res. Soc. Symp. Proc., vol. 13 (1983), p. 337. Techniques such as Gas Immersion Laser Doping (GILD) have proven valuable in the formation of shallow junctions in bulk silicon; refer to R. J. Pressley's, "Gas Immersion Laser Diffusion (GILDing)", in C. C. Tang, ed., *Laser Processing of Semiconductor Devices*, Proc. SPIE, vol. 385 (1983), p. 30. In addition, examination of excimer laser annealing of implant damage in bulk silicon has been demonstrated in D. H. Lowndes et al.'s "Pulsed Excimer Laser (308 nm) Annealing of Ion Implanted Silicon and Solar Cell Fabrication" and disclosed in J. Narayan et al., eds., *Laser-Solid Interactions and Transient Thermal Processing of Materials*, Mat. Res. Soc. Symp. Proc., vol. 13 (1983), p. 407. Excimer lasers recently have been used in the fabrication of complex devices such as the bipolar transistors applications, see K. H. Weiner et al.'s "Thin-Base Bipolar Transistor Fabrication Using Gas Immersion Laser Doping", *IEEE Electron Dev. Lett.*, vol. 10 (1989), p. 260; and S. D. Russell et al.'s, "Bipolar Transistors in Silicon-On-Sapphire (SOS): Effects of Nanosecond Thermal Processing", in *IEEE SOS/SOI Technology Conference Proceedings* (1990). Excimer lasers also recently have been used in the fabrication of backside illuminated CCDs as described in the pending patent applications referred to above.

Processing of semiconductor compounds often involves the use of toxic, corrosive, flammable, and pyroforic gases. This adds enormous constraints on the processing techniques and sample handling involved in order to provide equipment and operator safety. Laser processing complicates these issues by the requirement of a contained processing environment to meet OSHA regulations for class IV lasers. The prior art in microelectronics laser processing has met these requirements using complex systems which can introduce a variety of gases into a processing chamber at a predetermined pressure, with subsequent evacuation of the effluent. Such a system is described in detail in the pending patent application of S. D. Russell et al.'s "Excimer Laser-Assisted Etching of Silicon Using Halocarbon Ambients", U.S. Ser. No. 07/501,707. However, this typical research type vessel is inappropriate for high volume production sample handling. Similar complex chambers have been reported by S. Palmer et al. in "Laser-Induced Etching of Silicon at 248 nm by $F_2$/Ne," *Conference on Lasers and Electro-Optics Technical Digest Series* 1988, vol. 7 (Optical Society of America, Washington, D.C., 1988), p. 284. In addition to inefficient sample exchange, handling of microelectronic die that are highly susceptible to mechanical damage, such as backside illuminated CCDs which have thin membranes, about 10 microns in thickness, and devices which are sensitive to electrostatic discharge (ESD) damage, cannot be readily handled with these designs, even in low volume research environments.

Alternative techniques have been used for laser processing in applications that do not require the use of dangerous gases. Two examples are laser activation of ion implanted dopant and laser ablation of polymers. The procedure used for the former process involves the use of a single wafer holder, which is evacuated to a base pressure (nominally 20 millitorr) and backfilled to atmospheric pressure in an inert ambient such as argon. Ablation of polymers may take place in air; therefore, exhaust schemes are used to remove particulates from the sample being processed. One technique has been marketed by Image Micro Systems. The complexities in imaging an excimer laser to a small uniform spot for ablation applications requires careful integration of the optics, sample positioning, and exhaust system. Such a commercially available system utilizes a microscope stage for micropositioning of the sample, but is not designed for rapid sample exchange or handling. Wafer handling prevalent in the semiconductor industry has been incorporated into some systems, for example, the excimer laser planarization system by XMR. In the above systems, generally, single sample handling is involved and there are no obvious modifications for handling mechanically and/or electrostatically fragile die for laser processing. Schemes using complex optical recognition with robotic pick-and-place methods would still be difficult with the mechanical and ESD constraints Thus, it is evident that advances in laser processing has moved this technique into the realm of a production tool and the need is apparent for novel sample handling techniques which can combine rapid sample handling with the optical, mechanical and gas handling constraints unique to this technique. A need exists for a method of rapid sample handling in a production environment for laser processing of individual microelectronic die in an inert or nontoxic/non-corrosive ambient which is particularly suited for handling partially fabricated die, and die which are susceptible to mechanical and electrostatic damage. It is particularly applicable for backside illuminated CCDs requiring backside dopant activation and laser texturing of sidewalls as described in the above referenced pending patents.

SUMMARY OF THE INVENTION

The present invention is directed to providing a method of rapid sample handling in a production environment for laser processing of individual microelectronic die. Securing a die within a modified sample holder package provides for ESD and mechanical protection during laser processing. Placing the modified sample holder onto a feeder base portion that engages a "tractor-feed" translation subsystem assures that there is no unprotected handling of the die. A translating of a plurality of serially arranged modified sample holders that each hold a die to the laser processing structure allows the positioning of the die to be processed below and aligned with a laser processing structure. The engaging of a window holder of laser processing structure to the modified die holder seals the die in a processing chamber to assure an appropriate pressurizing with a gaseous ambient for the desired processing. An illuminating, repetitively if desired, of the die in the chamber with a laser beam of appropriate size, laser fluence, repetition rate and number of pulses processes the die. Next, a translating of the processed die from beneath laser processing structure allows a correctly positioning of the next die beneath the structure for processing. Optionally, a subsequent resecuring of a die holder top portion onto each modified die holder may be made to enclose the die in a chamber to protect the die from possible damage during transport or subsequent processing.

An object of the invention is to provide a method of rapid sample handling in a production environment for laser processing.

Another object is to provide for a rapid sample handling and laser processing in an inert or nontoxic/non-corrosive ambient or in other gases, if desired.

Another object is to provide a method of rapid sample handling for laser processing which is particularly suitable for handling partially fabricated die.

Another object is to provide a rapid sample handling and processing method for die which are susceptible to mechanical and/or electrostatic damage.

Still another object is to provide for a method of rapid sample handling for laser processing of microelectronic die that is particularly applicable for dopant activation or a laser texturing of sidewalls of backside illuminated CCDs.

Another object is to provide a method of rapid laser processing in which the processing is the laser annealing.

Another object is to provide a method of rapid laser processing in which the processing is the laser activation of ion implanted dopant.

Another object is to provide a method for the rapid handling for laser processing of partially fabricated die which are mechanically and electrostatically fragile.

Still another object is to provide a method for rapid handling of microelectronic die that incorporates pre-existing die holders or slightly modified die holders as part of the laser processing chamber.

Another object is to provide a cost effective method for rapid handling of individual microelectronic die with increased throughput in production and greatly increased yield due to the elimination of many die handling steps otherwise attendant a conventional processing operation.

These and other objects of the invention will become more readily apparent from the ensuing specification and claims when taken in conjunction with the appended drawings.

BRIEF DESCRIPTION OF THE DRAWINGS

FIG. 1 shows a prior art single CCD die holder.

FIG. 2 depicts corresponding gendered portions of the prior art die holder of FIG. 1.

FIG. 3 depicts the prior art die holder mated to adjacent die holders in accordance with a mechanical locking structure.

FIG. 4 depicts a modified die package.

FIG. 5 is a top view of a window holder for laser processing.

FIG. 6 is a bottom view of the window holder for laser processing of FIG. 5.

FIG. 7 is a cross-sectional view through lines 7—7 in FIG. 5 of the window holder on a die holder mounted on a feeder base portion for laser processing.

FIG. 8 is a schematic of a typical sampling handling station for laser processing in accordance with this inventive concept.

DESCRIPTION OF THE PREFERRED EMBODIMENT

Figure 9:
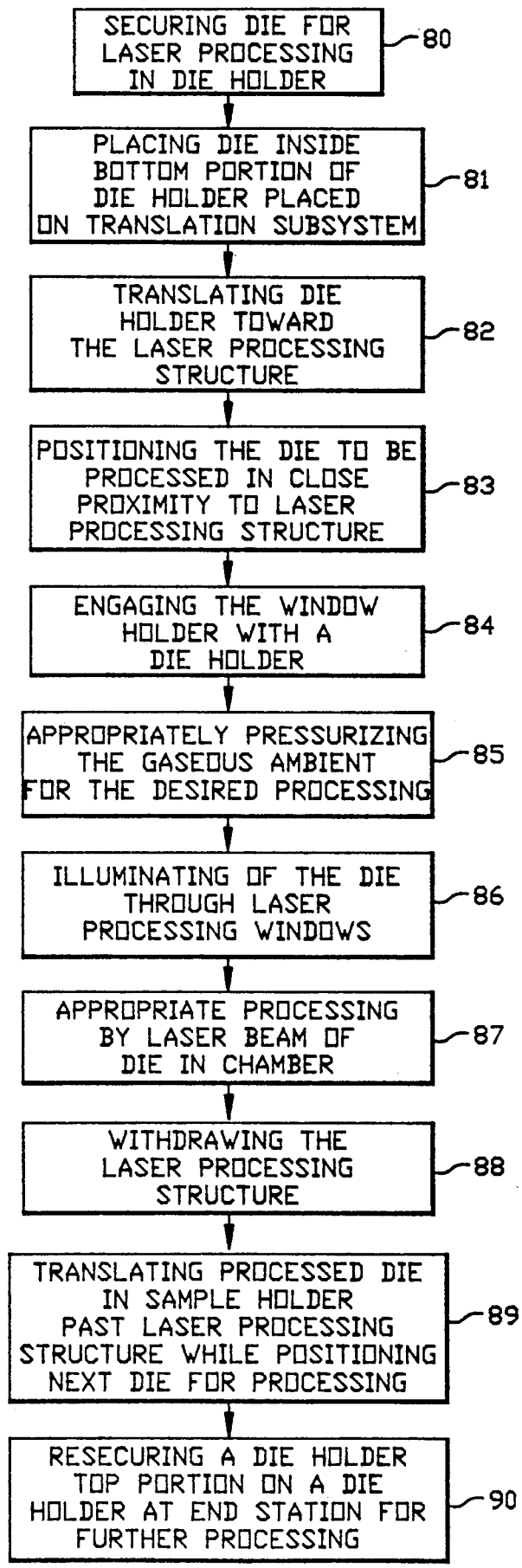
FIG. 9 sets forth the process flow of this inventive concept.

This method of rapid sample handling is particularly suited to a production environment for laser processing of individual microelectronic die and combines several subsystems, each with salient features which will be evident when described and in view of the supplied figures.

Referring to FIG. 1, a prior art a die package 10 includes a single die holder 20 is depicted which conventionally is used for storage or transportation of a die 15, for example, a CCD die, after fabrication in an electrostatic and mechanically safe environment. The CCD die is manually or mechanically placed and suitably secured within an appropriate shaped top cavity 21 in holder 20 to hold it for further processing. A bottom cavity 21' also is provided in die holder 20, see FIG. 2, to provide a sufficient chamber for holding die 15 when two die holders are stacked together, see the stacked die holders 20 and 20' in FIG. 3.

A pair of cutouts 22 are shaped for clearance of the mechanical device (such as vacuum tweezers) that are used to insert the die. The edge of the die holder has a number of keys 24 for correct orientation and mechanical rigidity of the package when engaged by a mechanical locking structure 20a. A circular ridge 23 is formed on a top portion 26 to provide mechanical protection for the encased die and to mate with a correspondingly shaped circular groove 23a is formed on a bottom portion 27.

Die package 10 is manufactured in such a way that top portion 26 and bottom portion 27 of die holder 20 are configured to be gendered (male/female) when two such holders are stacked in contact thereby fully enclosing and protecting die 15 as shown by the cross-sectional view of FIG. 3. Note that the vertical dimensions in the cross-sectional figures have been expanded by roughly a factor of two for improved clarity of detail.

FIG. 2 additionally shows corresponding gendered key portions 24 and 24', corresponding gendered circular ridges 23 and 23', and a corresponding gendered grooves 23a on die holder 20 and a die holder base 25.

FIG. 3 shows die holder 20 mated to die holder 20' by contact between top portion 26 and bottom portion 27, respectively, and secured with the gendered mechanical locking structure. Cavities 21 and 21' form a protective chamber for the die when two holders are appropriately mated. The location of a protected die 15 is shown, that is mechanically and electrostatically protected. The composition of the constituents of the die package is of such material to avoid electrostatic discharge (ESD) damage in accordance to standard practices.

Referring once again to the drawings, FIG. 4 shows a modified die package 40 used in one embodiment of the present inventive concept. It includes a die holder 40a having an appropriately shaped die cavity 41, cutouts 42, ridge 43, keys 44 and top 46 and bottom 47 portions and corresponding gendered portions as described above.

A top portion 46 of holder 40a has two new uses in addition to mating to a bottom portion of a second holder. Top portion 46 of holder 40a is configured to mate with a bottom or feeder base portion 57 of a processing structure 50, see FIGS. 5 and 6. The top portion 46 also is provided with two parallel rows of appropriately spaced and sized holes 49, see FIG. 4, to provide a means by which the holder may be translated. These holes directly engage the teeth or projections 58a of a "tractor-feed" mechanism 58 in a handling scheme that is similar to that used in dot matrix printers for movement of paper. This last feature is desirable during or after translation from a laser processing structure to protect the die from possible damage during further transport or subsequent processing. Incorporation of the aforedescribed features in the modified die holder assures the incorporation of mechanical and ESD protection throughout laser processing since the die to be processed must never be removed from its holder throughout the processing operation. Furthermore, these features provide an additional capability for the modified die holder since it can be used as a lower portion of a laser processing structure as described below.

FIG. 5 shows a top view, FIG. 6 a bottom view and FIG. 7 shows a cross-sectional view (along line 7—7 in FIG. 5) of laser processing structure package 50. This package includes a window holder 50a having a bottom or feeder base portion 57 which is appropriately gendered and keyed to mate with top portion 46 of modified die holder 40a. Window holder 50a of structure 50 is provided with a suitably sized window 51 appropriate for transmission of laser light onto die 15 while it is in the enclosed chamber formed by the mating of holders 50a and 40a, see FIGS. 7 and 8. For excimer laser applications, UV grade fused silica is an appropriate window material to assure the high transmission of wavelengths exceeding approximately 200 nm.

An opening 51' is provided in window holder 50a and has a rim portion 51a that is sized to mechanically support window 51. An epoxy bead 51a' mechanically bonds window 51 to the rim portion to hold it in place. An inlet 52, an outlet 53 and channels 59 are formed in window holder 50a and provide for the flow of inert gases through the inlet/outlets and to a processing chamber 50b that is created when the window holder 50a is sealingly engaged upon a die holder 40. The processing chamber created thereby is where die 15 is laser processed. The inlets have appropriate connections, not shown, to couple to external gas or vacuum sources consistent with conventional apparati and practices. The inlets and channel sizes, shapes and consequential flow characteristics may be modified for the job at hand as recognized by one skilled in the art.

By adjusting the gas flow conditions in accordance with well-known procedures, such as, over-pressuring the region immediately above the region illuminated by the laser, backflow of air onto the sample is prevented. Laser-activated chemical reactions such as etching of silicon in a chlorofluorocarbon ambient and/or dopant activation in an inert ambient as described in the pending patent applications listed above thereby can be implemented without complex gas handling procedures in an ESD and mechanically safe environment. Additional details as to the implementation of this inventive concept are described below.

Looking to FIG. 8, a schematic of a sample handling station 60 for laser beam 100 processing is depicted, it being understood that this embodiment is for the purposes of demonstration only and not to be construed as being limiting. The station includes a plurality of translation subsystems 60' and and 60" etc., each of which is used to transport a feeder base portion 57 mated to carry a modified die holder 40a, 40a', 40a" etc. that each holds a die 15, 15' 15" etc. The plurality of translation subsystems are engaged by a "tractor-feed" mechanism TF having one or more sprocketed wheels 58 and appropriate drive mechanisms to synchronize its rotational motion to the desired linear translation of modified sample holder 40a, 40a', 40a". Numerous variations will become apparent to those versed in the relevant arts and appropriate designs will be evident to one familiar with mechanical design having in mind the disclosed requirements of this invention.

The plurality of translation subsystems 60' and 60" (etc.) can be concatenated to move modified die holders 40a, 40a', 40a" (etc.) into and out of the location required for mating with laser processing structure 50. A mechanical engaging structure 70 is provided to hold laser processing structure 50 in close proximity to the modified die holder 40a to be processed. Complete mating of the structures is not required, however, in some applications may be desirable. In such cases, mechanical structure 70' may provide for a vertical sealing engagement of laser processing structure 50 to a die holder 40a so that processing gases are sealed in the processing chamber. A modified translation subsystem and modified mechanical structure may also be included to allow for reorienting the incident angle of the laser beam with respect to the sample. In all modifications, the die is securely and safely held in the die holder throughout the translation and processing without requiring any handling that might otherwise damage the die. Extensions to this inventive concept may also include a plurality of sample handling stations 60 which may be utilized simultaneously using a fiber bundle homogenizer, such as described in U.S. Pat. No. 4,932,747 by Stephen D. Russell et al. The fiber bundle homogenizer allows the conversion and redirection of a single laser beam to a plurality of output beams (or alternately a plurality of laser beams to one or more output beams) which thereby can enhance the utility of the invention disclosed herein for a production environment.

The process flow of one embodiment of this inventive concept is set forth in FIG. 9. Securing 80 a die 15 in a modified die holder 40a provides for ESD and mechanical protection during laser processing. Placing 81 a modified die holder 40a holding the die to be processed onto a feeder base portion 57 to engage a "tractor-feed" translation subsystem TF assures that there is no handling of an individual die without the protection afforded by the modified die holder. Translating 82 a plurality of modified sample holders 40a, 40a', 40a" etc. that each hold a die to laser processing structure 50 allows a positioning 83 of the die to be processed below and aligned with the laser processing structure. An engaging 84 of a window holder 50a of laser processing structure 50 to die holder 40a seals the die in a processing chamber 50b to assure the appropriate pressurizing 85 of a processing chamber 50b with a gaseous ambient for a desired processing. An illuminating 86, repetitively if desired, of die 15 with a laser beam 100 of appropriate size, laser fluence, repetition rate and number of pulses provides for at least part of the appropriate processing 87. Next, after a withdrawing 88 of laser processing structure 50, a translating 89 of the processed die can be made from beneath laser processing structure 50 while the next die is being correctly positioned beneath the structure for processing to allow for a subsequent resecuring 90 of another die holder top portion 40a" onto each modified die holder 40a, 40a' 40a" etc. to enclose a chamber that protects the die from possible damage during transport or subsequent processing.

The method and apparatus described above provides for "mating" of the laser processing structure to the modified die holder by being in close proximity to one another. There may be some applications with processing variations where it is desirable to form a more secure physical mating between these two portions. This is accommodated in the above description by using a modified support structure 70 with its aforementioned vertical motion that is configured to mate with appropriately gendered and keyed structures 50a and 40a as previously described.

An alternate embodiment of the present inventive concept is to replace modified die holder 40a with the die holder 20 used in the prior art. In this case, window holder 50a can still be used as described; however, conventional means to transport the holder into processing position must be employed. This can include devices such as (but not limited to) a gravity conveyor, ball transfer conveyor, or conveyor belting techniques for motion. This invention also is amenable with robotic pick and place techniques if the die to be laser processed remain in the protective die holder 40a or 20 and are placed in proper relation to laser processing structure 50 prior to laser illumination.

In applications where it is desirable to use a gaseous ambient that should not be released into the atmosphere, but is noncorrosive, a simple enclosure around the present invention's system 100 with appropriate reclamation or scrubbing system may be employed. Due to variations in die sizes used in the semiconductor industry, no dimensions have been included in this specification; however, extensions to any conceivable die, device or sample easily can be accommodated. Conventional mechanical modifications to the support structures and translation subsystems can be provided for variable angle illumination of the processed die. Such a modification is particularly useful in laser texturing sidewalls of backside illuminated CCDs.

In laser etching applications requiring significant material removal from the die being processed, a means for removing etching by-products to prevent deposition on window 51 may be desirable. This is easily accommodated within the scope of the above referral to prior laser etching patent applications since the ambients are nontoxic and noncorrosive, and an opening in or near the window (or removal of the window) will suffice.

Obviously, numerous modifications and variations of the present invention are possible in light of the above teachings. It is therefore to be understood that within the scope of the appended claims the invention may be practiced otherwise than as specifically described herein.

We claim:

1. A method of rapid sample handling in a production environment for laser processing of individual microelectronic die comprising:
    securing a die in a modified die holder to provide for electrostatic and mechanical protection during laser processing;
    placing a modified die holder holding the die to be processed onto a feeder base portion to engage a "tractor-feed" translation subsystem;
    translating a plurality of serially arranged modified sample holders that each hold a die to a laser processing structure;
    positioning of the die to be processed below and aligned with the laser processing structure;
    engaging a window holder of the laser processing structure to die holder to seal the die in a processing chamber;
    appropriately pressurizing of the processing chamber with a gaseous ambient for a desired processing;
    illuminating, repetitively if desired, of the die with a laser beam of appropriate size, laser fluence, repetition rate and number of pulses; and
    appropriately processing the die by the laser illuminating while undergoing the appropriately pressurizing in the gaseous ambient.

2. A method according to claim 1 further including:
    withdrawing the laser processing structure after said processing; and
    translating the processed die after said withdrawing of the laser processing structure from beneath the laser processing structure while the next die is being correctly positioned beneath the laser processing structure for processing.

3. A method according to claim 2 further including:
    resecuring another die holder top portion onto each modified die holder after the translating to enclose a chamber that protects the die from possible damage during transport or subsequent processing.

4. A method according to claim 1 in which the processing is the laser annealing.

5. A method according to claim 2 in which the processing is the laser annealing.

6. A method according to claim 3 in which the processing is the laser annealing.

7. A method according to claim 1 in which the processing is the laser activation of ion implanted dopant.

8. A method according to claim 2 in which the processing is the laser activation of ion implanted dopant.

9. A method according to claim 3 in which the processing is the laser activation of ion implanted dopant.

10. A method according to claim 1 in which the processing is the laser-assisted etching.

11. A method according to claim 2 in which the processing is the laser-assisted etching.

12. A method according to claim 3 in which the processing is the laser-assisted etching.

13. A method according to claim 1 in which the processing is the laser texturing of sidewalls.

14. A method according to claim 2 in which the processing is the laser texturing of sidewalls.

15. A method according to claim 3 in which the processing is the laser texturing of sidewalls.

16. A method according to claim 1 in which the processing is the fabrication of backside illuminated charge-coupled devices (CCDs).

17. A method according to claim 2 in which the processing is the fabrication of backside illuminated charge-coupled devices (CCDs).

18. A method according to claim 3 in which the processing is the fabrication of backside illuminated charge-coupled devices (CCDs).

19. A die processing structure for a die holder translating mechanism to accommodate a laser processing beam comprising:
   a die holder provided with a cavity sized to hold said die and being provided with at least one first surface feature configured to engage said translating mechanism to impart motion thereto and being further provided with at least one second surface feature; and
   a window holder having a window transparent to said laser processing beam and sized to cover said cavity and having at least one mating surface configured to mate with said at least one said second surface feature to close said cavity to form a processing chamber with said window.

20. A die processing structure according to claim 19 in which said die holder is provided with inlet and outlet ducts and channels communicating with said processing chamber to accommodate the laser processing of said die.

21. A die processing structure according to claim 20 further including:
   a support structure configured to mate with said die holder and said window holder during said laser processing.

* * * * *